US006850578B1

(12) United States Patent
Koyata

(10) Patent No.: US 6,850,578 B1
(45) Date of Patent: Feb. 1, 2005

(54) DIGITAL SIGNAL PROCESSING APPARATUS AND DIGITAL PROCESSING METHOD

(75) Inventor: Tomohiro Koyata, Tokyo (JP)

(73) Assignee: Sony Corporation, Tokyo (JP)

( * ) Notice: Subject to any disclaimer, the term of this patent is extended or adjusted under 35 U.S.C. 154(b) by 651 days.

(21) Appl. No.: 09/645,789

(22) Filed: Aug. 24, 2000

(30) Foreign Application Priority Data

Sep. 1, 1999 (JP) ........................................ P11-247340
Aug. 14, 2000 (JP) .................................... P2000-245933

(51) Int. Cl.[7] ............................ H03D 1/00; H03L 27/06
(52) U.S. Cl. ........................ 375/340; 375/342; 375/343
(58) Field of Search ................................ 375/342, 340, 375/341, 343; 370/395.64

(56) References Cited

U.S. PATENT DOCUMENTS 5,051,991 A * 9/1991 Szczutkowski ............. 370/519
6,233,279 B1 * 5/2001 Boon .................... 375/240.08
6,289,059 B1 * 9/2001 Yamaguchi et al. ........ 375/341
6,377,628 B1 * 4/2002 Schultz et al. ......... 375/240.26
6,621,881 B2 * 9/2003 Srinivasan .................. 375/340

OTHER PUBLICATIONS

Ang et al, Video Compression Makes Big Gains, IEEE Spectrum, Oct. 1991.*

Patent Abstracts of Japan, JP 10 198400, Jul. 31, 1998.

C. A. Lanciani, et al., Multimedia Signal Processing, XP–010233896, pp. 53–58, "Psychoacoustically–Based Processing of MPEG–I Layer 1–2 Encoded Signals", Jun. 23, 1997.

* cited by examiner

*Primary Examiner*—Temesghen Ghebretinsae
*Assistant Examiner*—Qutub Ghulamali

(57) ABSTRACT

A digital signal of which input data has been segmented as block each having a predetermined data amount and highly efficiently encoded along with an adjacent block is decoded, edited, and then highly efficiently encoded. A delay that takes place in such signal processes is compensated. Thus, part of a digital signal that has been highly efficiently encoded digital signal can be edited.

10 Claims, 13 Drawing Sheets

| NUMBER OF UNIT BLOCKS CONTAINED | | BIT ALLOCATION INFORMATION DUALLY WRITTEN | | SCALE FACTOR INFORMATION DUALLY WRITTEN | |
|---|---|---|---|---|---|
| CODE | QTY | CODE | QTY | CODE | QTY |
| 000 | 20 | 00 | 0 | 000 | 0 |
| 001 | 28 | 01 | 28 | 001 | 8 |
| 010 | 32 | 10 | 44 | 010 | 12 |
| 011 | 36 | 11 | 52 | 011 | 16 |
| 100 | 40 | | | 100 | 24 |
| 101 | 44 | | | 101 | 36 |
| 110 | 48 | | | 110 | 44 |
| 111 | 52 | | | 111 | 52 |

DIGITAL SIGNAL PROCESSING APPARATUS AND DIGITAL PROCESSING METHOD

BACKGROUND OF THE INVENTION

1. Field of the Invention

The present invention relates to a signal processing apparatus and a signal processing method that allow editing a part of a digital signal that has been segmented as blocks each of which has a predetermined data amount and each block to be highly efficiently encoded along with an adjacent block.

2. Description of the Related Art

As a related art reference of a highly efficiently encoding method for an audio signal, for example, a transform encoding method is known. The transform encoding method is one example of a block-segmentation frequency band dividing method. In the transform encoding method, a time-base audio signal is segmented into blocks at intervals of a predetermined unit time period. The time-base signal of each block is converted into a frequency-base signal (namely, orthogonally transformed). Thus, the time-base signal is divided into a plurality of frequency bands. In each frequency band, blocks are encoded. As another related art reference, a sub band coding (SBC) method as an example of a non-block-segmentation frequency band dividing method is known. In the SBC method, a time-base audio signal is divided into a plurality of frequency bands and then encoded without segmenting the signal into blocks at intervals of a predetermined unit time period.

As another related art reference, a highly efficiently encoding method that is a combination of the band division encoding method and the SBC method is also known. In this highly efficiently encoding method, a signal of each sub band is orthogonally transformed into a frequency-base signal corresponding to the transform encoding method. The transformed signal is encoded in each sub band.

As an example of a band dividing filter used for the above-described sub band coding method, for example a QMF (Quadrature Mirror Filter) is known. The QMF is described in for example R. E. Crochiere "Digital coding of speech in sub bands" Bell Syst. Tech. J. Vol. 55. No. 8 (1976). An equal band width filter dividing method for a poly-phase quadrature filter and an apparatus thereof are described in ICASSP 83, BOSTON "Polyphase Quadrature filters—A new sub band coding technique", Joseph H. Rothwiler.

As an example of the orthogonal transform method, an input audio signal is segmented into blocks at intervals of a predetermined unit time period (for each frame). Each block is transformed by for example a fast Fourier transforming (FFT) method, a discrete cosine transforming (DCT) method, or a modified DCT transforming (MDCT) method. As a result, a time-base signal is converted into a frequency-base signal. The MDCT is described in for example ICASSP 1987, "Sub band/Transform coding Using Filter Bank Designs Based on Time Domain Aliasing Cancellation", J. P. Princen and A. B. Bradley, Univ. of Surrey Royal Melbourne Inst. of Tech.

On the other hand, an encoding method that uses a frequency division width in consideration of the hearing characteristics of humans for quantizing each sub band frequency component is known. In other words, so-called critical bands of which their band widths are proportional to their frequencies have been widely used. With the critical bands, an audio signal may be divided into a plurality of sub bands (for example, 25 sub bands). According to such a sub band coding method, when data of each sub band is encoded, a predetermined number of bits is allocated for each sub band. Alternatively, an adaptive number of bits is allocated for each sub band. For example, when MDCT coefficient data generated by the MDCT process is encoded with the above-described bit allocating method, an adaptive number of bits is allocated to the MDCT coefficient data of each block of each sub band. With the allocated bits, each block is encoded.

An example of a related art reference of such a bit allocating method and an apparatus corresponding thereto is described as "a method for allocating bits corresponding to the strength of a signal of each sub band" in IEEE Transactions of Acoustics, Speech, and Signal Processing, vol. ASSP-25, NO. 4, August (1977). As another related art reference, "a method for fixedly allocating bits corresponding to a signal to noise ratio for each sub band using a masking of the sense of hearing" is described in ICASP, 1980, "The critical band coder—digital encoding of the perceptual requirements of the auditory system", M. A. Kransner MIT.

When each block is encoded for each sub band, each block is normalized and quantized for each sub band. Thus, each block is effectively encoded. This process is referred to as block floating process. When MDCT coefficient data generated by the MDCT process is encoded, the maximum value of the absolute values of the MDCT coefficients is obtained for each sub band. Corresponding to the maximum value, the MDCT coefficient data is normalized and then quantized. Thus, the MDCT coefficient data can be more effectively encoded. The normalizing process can be performed as follows. From a plurality of numbered values, a value used for the normalizing process is selected for each block using a predetermined calculating process. The number assigned to the selected value is used as normalization information. The plurality of values are numbered so that they increment by 2 dB of an audio level.

The above-described highly effectively encoded signal is decoded as follows. With reference to the bit allocation information, the normalization information, and so forth for each sub band, MDCT coefficient data is generated corresponding to a signal that has been highly efficiently encoded. Since a so-called inversely orthogonally transforming process is performed corresponding to the MDCT coefficient data, time-base data is generated. When the highly efficiently encoding process is performed, if the frequency band is divided into sub bands by a band dividing filter, the time-base data is combined using a sub band combining filter.

When normalization information is changed by an adding process, a subtracting process, or the like, a reproduction level adjusting function, a filtering function, and so forth can be accomplished for a time-base signal of which an encoded data has been decoded that is known as the editing method of data. According to this method, since the reproduction level can be adjusted by a calculating process such as an adding process or a subtracting process, the structure of the apparatus becomes simple. In addition, since a decoding process, an encoding process, and so forth are not excessively required, the reproduction level can be adjusted without a deterioration of the signal quality. In addition, in this method, an encoded signal can be modified without changing the time period of the generated signal by decoding, part of the signal generated by the decoding process can be changed with no influence from other parts.

In other than the method for changing normalization information, when the chronological relation between a decoded signal and an original signal (namely, a delay amount of phases) is obtained, encoded data that has the same chronological relation with a decoded signal can be generated.

When encoded data is changed in the above-described method, an editing operation such as a level adjustment can be performed corresponding to an increase or decrease of one value of normalization information (for example, 2 dB). Thus, such a level adjustment cannot be more precisely performed. In the chronological direction, an editing operation such as a level adjustment cannot be performed in the accuracy exceeding the minimum time unit corresponding to the encoding data format of the applied encoding method (the minimum time unit is for example, 1 frame).

Thus, due to such restrictions corresponding to the applied encoding method and encoding data format, the editing operations in the reproduction level and the frequency region and the editing operation in the chronological direction cannot be more accurately performed.

OBJECTS AND SUMMARY OF THE INVENTION

Therefore, an object of the present invention is to provide a digital signal processing apparatus, a digital signal processing method, a digital signal recoding apparatus, and a digital signal recording method that allow an editing process for such as a reproducing level that is less affected by an applied encoding format to be performed. Another object of the present invention is to provide a record medium on which such data is recorded.

A first aspect of the present invention is a digital signal processing apparatus for processing an input digital signal that has been segmented as blocks each having a predetermined data amount and highly efficiently encoded along with adjacent blocks, comprising a decoding means for decoding the highly efficiently encoded digital signal along with adjacent blocks, a changing process means for changing the decoded digital signal, an encoding means for highly efficiently encoding the changed digital signal along with adjacent blocks, and a delay compensating means for compensating a delay of the decoded signal decoded by the decoding means.

A second aspect of the present invention is a digital signal processing method for processing an input digital signal that has been segmented as blocks each having a predetermined data amount and highly efficiently encoded along with adjacent blocks, comprising the steps of (a) decoding the highly efficiently encoded digital signal along with adjacent blocks, (b) changing the decoded digital signal, and (c) highly efficiently encoding the changed digital signal along with adjacent blocks and compensating a delay of the decoded signal decoded at step (a).

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Figure 1:
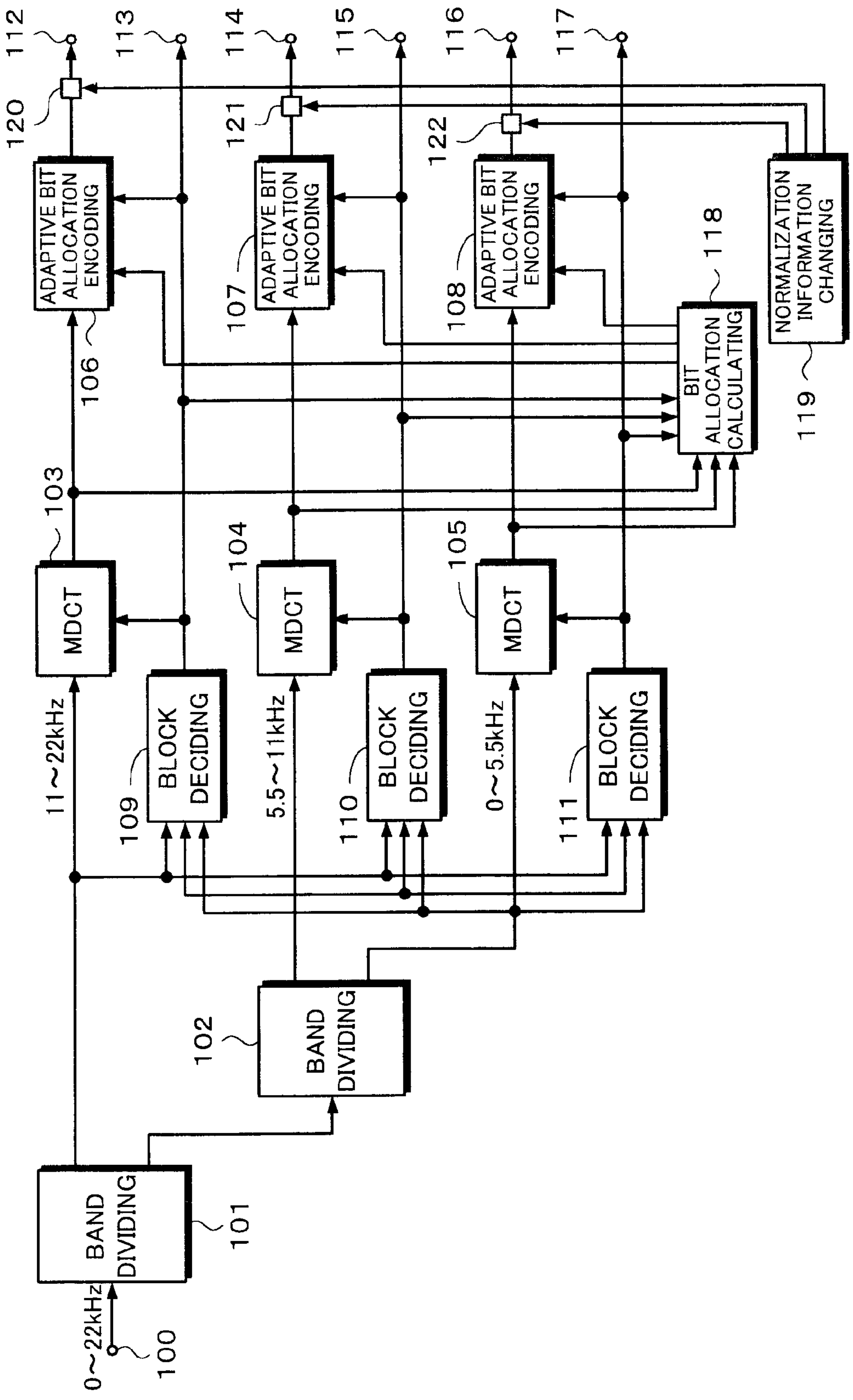
FIG. 1 is a block diagram showing an example of the structure of a digital signal recording apparatus according to the present invention.

Next, with reference to FIG. 1, an example of the structure of a digital signal recording apparatus according to the present invention will be described. An embodiment of the present invention is a digital signal recording apparatus having an encoding process system for performing a highly efficient encoding process for an input digital signal such as an audio PCM (Pulse Code Modulation) signal corresponding to sub band coding (SBC) process, adaptive transform coding (ATC) process, and adaptive bit allocating process. In this example, as an input digital signal, a digital audio data signal of which an audio signal (of a speech of a person, a singing voice of a person, an instrumental sound, or the like is digitized), a digital video signal, or the like can be handled.

When the sampling frequency is 44.1 kHz, an audio PCM signal with a frequency band of 0 to 2 kHz is supplied to a band dividing filter 101 through an input terminal 100. The band dividing filter 101 divides the supplied signal into a signal with a sub band of 0 to 11 kHz and a signal with a sub band of 11 kHz to 22 kHz. The signal with the sub band of 11 to 22 kHz is supplied to an MDCT (Modified Discrete Cosine Transform) circuit 103 and block designating circuits 109, 110, and 111.

The signal with the sub band of 0 kHz to 11 kHz is supplied to a band dividing filter 102. The band dividing filter 102 divides the supplied signal into a signal with a sub band of 5.5 kHz to 11 kHz and a signal with a sub band of 0 to 5.5 kHz. The signal with the sub band of 5.5 to 11 kHz is supplied to an MDCT circuit 104 and the block designating circuits 109, 110, and 111. On the other hand, the signal with the sub band of 0 to 5.5 kHz is supplied to an MDCT circuit 105 and the block designating circuits 109, 110, and 111. Each of the band dividing filters 101 and 102 can be composed of a QFM filter or the like. The block designating circuit 109 designates the block size corresponding to the supplied signal. Information that represents the designated block size is supplied to the MDCT circuit 103 and an output terminal 113.

The block designating circuit 110 designates the block size corresponding to the supplied signal. Information that represents the designated block size is supplied to the MDCT circuit 104 and an output terminal 115. The block designating circuit 111 designates the block size corresponding to the supplied signal. Information that represents the designated block size is supplied to the MDCT circuit 105 and an output terminal 117. The block designating circuits 109, 110, and 111 cause the block size or the block length to be adaptively changed corresponding to the input data before the orthogonally transforming process is performed.

FIGS. 2A, 2B, 2C, and 2D show examples of data of individual sub bands supplied to the MDCT circuits 103, 104, and 105. The block designating circuits 109, 110, and 111 independently designate the sizes of orthogonally transformed blocks of individual sub bands that are output from the band dividing filters 101 and 102. In addition, the MDCT circuits 103, 104, and 105 can change time resolutions corresponding to time characteristics and frequency distributions of the signals. When the input signal is chronologically semi-steady, a long mode of which the size of each orthogonally transformed block is for example 11.6 ms is used.

Figure 2A:
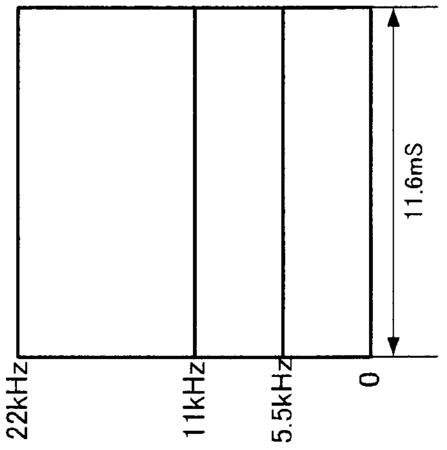
FIG. 2A is a schematic diagram for explaining an orthogonal transform block size in the case that a supplied signal is semi-regular.
Figure 2B:
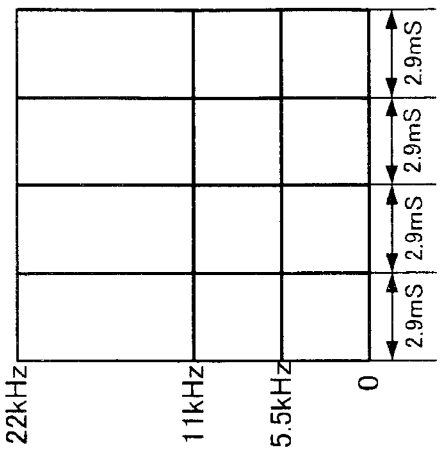
FIG. 2B is a schematic diagram for explaining an orthogonal transform block size of short mode in the case that a supplied signal is non-regular.
Figure 2C:
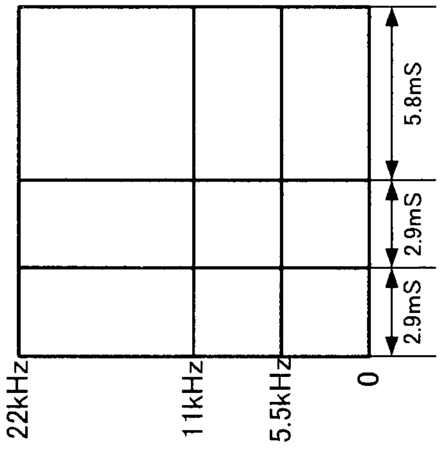
FIG. 2C is a schematic diagram for explaining an orthogonal transform block size of middle mode-a in the case that a supplied signal is non-regular.
Figure 2D:
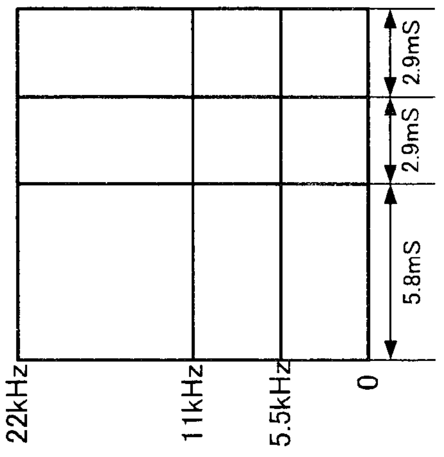
FIG. 2D is a schematic diagram for explaining an orthogonal transform block size of middle mode-b in the case that a supplied signal is non-regular.

On the other hand, when the input signal is non-steady, one of modes of which the size of each orthogonally transformed block is ½ or ¼ of the size of each orthogonally transformed block of the long mode is used. In reality, in a short mode, the size of each orthogonally transformed block is ¼ of the size of each orthogonally transformed block of the long mode. Thus, in the short mode, the size of each orthogonally transformed block is 2.9 ms as shown in FIG. 2B. There are two middle modes that are a middle mode a and a middle mode b. In the middle mode a, the size of one orthogonally transformed block is ½ of the size of each orthogonally transformed block of the long mode and the size of another orthogonally transformed block is ¼ of the size of each orthogonally transformed block of the long mode. Thus, in the middle mode a, the size of one orthogonally transformed block is 5.8 ms and the size of another orthogonally transformed block is 2.9 ms as shown in FIG. 2C. In the middle mode b, the size of one orthogonally transformed block is ¼ of the size of each orthogonally transformed block of the long mode and the size of another orthogonally transformed block is ½ of the size of each orthogonally transformed block of the long block. Thus, in the middle mode b, the size of one orthogonally transformed block is 2.9 ms and the size of another orthogonally transformed block is 5.8 ms as shown in FIG. 2D. With such various time resolutions, complicated input signals can be handled.

To consider a limitation caused from the circuit scale of the apparatus and or the like, size of each orthogonally transformed block can be divided in more complicated manners. Thus, it is clear that real input signals can be more adequately processed. The block size is designated by the block designating circuits 109, 110, and 111. Information that represents the designated block size is supplied to the MDCT circuits 103, 104, and 105, a bit allocation calculating circuit 118, and the output terminals 113, 115, and 117.

Returning to FIG. 1, the MDCT circuit 103 performs the MDCT process corresponding to the block size designated by the block designating circuit 109. High band MDCT coefficient data or frequency-base spectrum data that is generated by such a process is combined for each critical band and supplied to the adaptive bit allocation encoding circuit 106 and the bit allocation calculating circuit 118. The MDCT circuit 104 performs the MDCT process corresponding to the block size designated by the block designating circuit 110. Middle band MDCT coefficient data or frequency-base spectrum data generated by such a process is supplied to the adaptive bit allocation encoding circuit 107 and the bit allocation calculating circuit 118 after the critical band width thereof is divided in consideration of the effectiveness of the block floating process.

The MDCT circuit 105 performs the MDCT process corresponding to the block size designated by the block designating circuit 111. As the result of the process, low band MDCT coefficient data or frequency-base spectrum data is combined for each critical band and then supplied to the adaptive bit allocation encoding circuit 108 and the bit allocation calculating circuit 118. The critical bands are frequency bands that are divided in consideration of the hearing characteristics of humans. When a particular pure sound is masked with a narrow band noise that has the same strength thereof and that is in the vicinity of the frequency band of the pure sound, the band of the narrow band noise is a critical band. The band widths of the critical bands are proportional to their frequencies. The frequency band of 0 to 22 kHz is divided into for example 25 critical bands.

The bit allocation calculating circuit 118 calculates for example the masking amount, energy, and/or peak value for each sub band in consideration of the above-described critical bands and block floating for a masking effect (that will be described later) corresponding to the supplied MDCT coefficient data or frequency-base spectrum data and block size information. Corresponding to the calculated results, the bit allocation calculating circuit 118 calculates the scale factor and the number of allocated bits for each sub band. The calculated number of allocated bits is supplied to the adaptive bit allocation encoding circuits 106, 107, and 108. In the following description, each sub band as a bit allocation unit is referred to as unit block.

The adaptive bit allocation encoding circuit 106 re-quantizes the spectrum data or MDGT coefficient data supplied from the MDCT circuit 103 corresponding to the block size information supplied from the block designating circuit 109 and to the number of allocated bits and the scale factor information supplied from the bit allocation calculating circuit 118. As the result of the process, the adaptive bit allocation encoding circuit 106 generates encoded data corresponding to the applied encoding format. The encoded data is supplied to a calculating device 120. The adaptive bit allocation encoding circuit 107 re-quantizes the spectrum data or MDCT coefficient data supplied from the MDCT circuit 104 corresponding to the block size information supplied from the block designating circuit 110 and to the number of allocated bits and scale factor information supplied from the bit allocation calculating circuit 118. As the result of the process, encoded data corresponding to the applied encoding format is generated. The encoded data is supplied to a calculating device 121.

The adaptive bit allocation encoding circuit 108 re-quantizes the spectrum data or MDCT coefficient data supplied from the MDCT circuit 105 corresponding to the block size information supplied from the block designating circuit 110 and to the number of allocated bits and scale factor information supplied from the bit allocation calculating circuit 118. As the result of the process, encoded data corresponding to the applied encoding format is generated. The encoded data is supplied to a calculating device 122.

Figure 3:
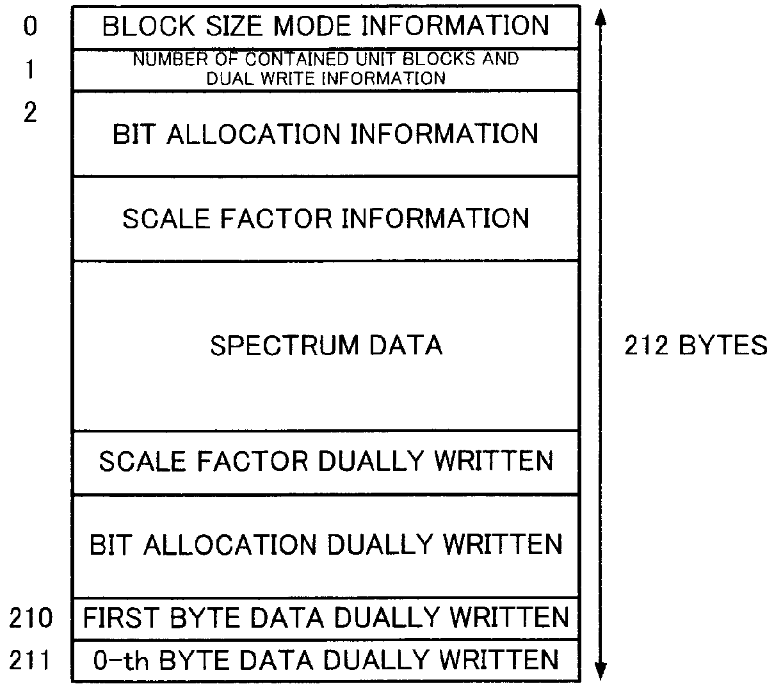
FIG. 3 is a schematic diagram showing an example of an encoding data format according to the present invention.

FIG. 3 shows an example of the format of encoded data. In FIG. 3, numeric values 0, 1, 2, . . . , 211 on the left side represent bytes. In this example, one frame is composed of 212 bytes. At the 0-th byte position, block size information of each sub band designated by the block designating circuits 109, 110, and 111 shown in FIG. 1 is placed. At the first byte position, information that represents the number of unit blocks is placed. In the high band, the probability of which no bits are allocated to unit blocks by the bit allocation calculating circuit 118 and thereby they are not recorded becomes high. Thus, to deal with such a situation, the number of unit blocks is designated in such a manner that more bits are allocated to the middle band region and the low band region that largely affect the sense of hearing than the high band region. In addition, at the first byte position, the number of unit blocks in which bit allocation information is dually written and the number of unit blocks in which scale factor information is dually written are placed.

To correct an error, the same information is dually written. In other words, data recorded at a particular byte is dually recorded to another byte. Although the strength against an error is proportional to the amount of data that is dually written, the amount of data used for spectrum data decreases. In the example of the encoding format, since the number of unit blocks in which bit allocation information is dually written and the number of unit blocks in which scale factor information is dually written are independently designated, the strength against an error and the number of bits used for spectrum data can be optimized. The relation between a code in a predetermined bit and the number of unit blocks has been defined as a format.

Figure 4:
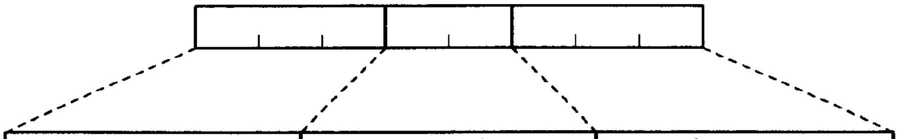
FIG. 4 is a schematic diagram showing details of data of the first byte of FIG. 3.

FIG. 4 shows an example of contents of eight bits of the first byte. In this example, the first three bits represent the number of contained unit blocks. The next two bits represent the number of unit blocks to which the bit allocation information is dually written. The last three bits represent the number of unit blocks to which the scale factor information is dually written.

At the second byte position shown in FIG. 3, the bit allocation information of each unit block is placed. One unit block is composed of for example four bits. Thus, the bit allocation information for the number of unit blocks starting with 0-th unit block is placed. The bit allocation information is followed by scale factor information of each unit block. For the scale factor information, each unit block is composed of for example six bits. Thus, the scale factor information for the number of unit blocks starting with the 0-th unit block is placed.

The scale factor information is followed by spectrum data of each unit block. The spectrum data for the number of unit blocks that are really contained is placed. Since the data amount of spectrum data contained in each unit block has been defined as a format, with the bit allocation information, the relation of data can be obtained. When the number of bits allocated to a particular unit block is zero, the unit block is not contained.

The spectrum information is followed by the scale factor that is dually written and the bit allocation information that is dually written. The scale factor information and the bit allocation information are dually written corresponding to the dual write information shown in FIG. 4. At the last byte (211-st byte) and the second last byte (210-th byte), information at the 0-th byte and information at the first byte are dually written. The two bytes in which such information is dually written has been defined as a format. However, scale factor information that is dually written and the bit allocation information that is dually written cannot be changed.

One frame contains 1024 PCM samples that are supplied through the input terminal 100. The first 512 samples are used in the immediately preceding frame. The last 512 samples are used in the immediately following frame. This arrangement is used from a view point of an overlap of the MDCT process.

Returning to FIG. 1, a normalization information changing circuit 119 generates values for changing scale factor information for a low band, a middle band, and a high band and supplies the values corresponding to the low band, the middle band, and the high band to the calculating devices 120, 121, and 122, respectively. The calculating device 120 adds the value supplied from the normalization information changing circuit 119 to the scale factor information contained in the encoded data supplied from the adaptive bit allocation encoding circuit 106. When the value that is output from the normalization information changing circuit 119 is negative, the calculating device 120 operates as a subtracting device. The calculating device 121 adds the value supplied from the normalization information changing circuit 119 to the scale factor information contained in the encoded data supplied from the adaptive bit allocation encoding circuit 107. When the value that is output from the normalization information changing circuit 119 is negative, the calculating device 121 operates as a subtracting device.

The calculating device 122 adds the value supplied from the normalization information changing circuit 119 to the scale factor information contained in the encoded data supplied from the adaptive bit allocation encoding circuit 108. When the value that is output from the normalization information changing circuit 119 is negative, the calculating device 122 operates as a subtracting device. The normalization information changing circuit 119 operates corresponding to an operation of the user through for example an operation panel. In this case, the level adjusting process, the filtering process, and so forth will be described later that the user desires are accomplished. Output signals of the calculating devices 120, 121, and 122 are supplied to a conventional recording system (not shown) through output terminals 112, 114, and 116, respectively. The recording system records the output signals of the calculating devices 120, 121, and 122 to a record medium such as a magneto optical disc.

The recording system records at least one type of encoded data generated by properly controlling addresses of tracks formed on the record medium along with data that has not been processed in such a manner that the encoded data and non-processed data are separately recorded. This process will be described later. Thus, at least one type of encoded data and/or pre-edited data are recorded on the record medium. As a record medium, besides a magneto optical disc, a disc shaped record medium (such as a magnetic disc), a tape shaped record medium (such as a magnetic tape or an optical take), or a semiconductor memory (such as an IC memory, a card type memory, a memory card, or an optical memory) may be used.

Figure 5:
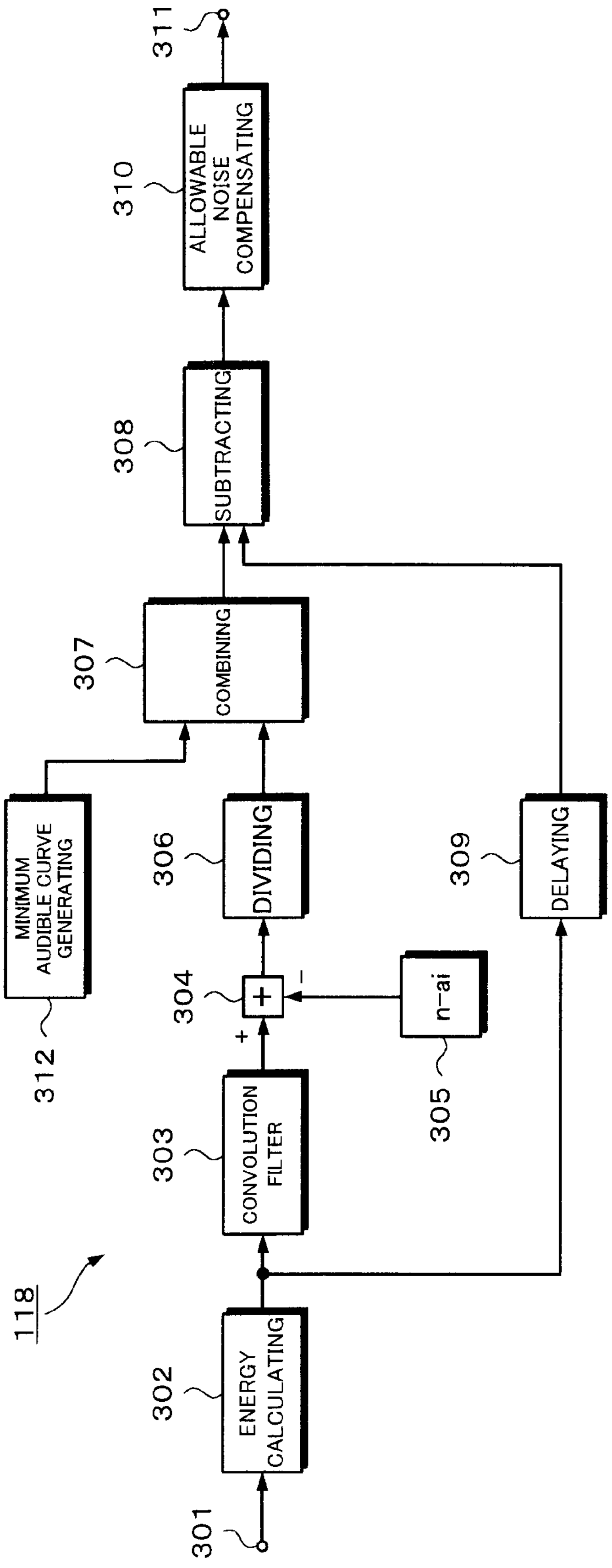
FIG. 5 is a block diagram showing an example of the structure of a bit allocation calculating circuit.

Next, each process will be described in detail. FIG. 5 shows an example of the structure of the bit allocation calculating circuit 118. Frequency-base spectrum data or MDCT coefficients supplied from the MDCT circuits 103, 104, and 105 through an input terminal 301 is supplied to an energy calculating circuit 302. In addition, block size information is supplied from the block designating circuits 109, 110, and 111 through the input terminal 301 to the energy calculating circuit 302. The energy calculating circuit 302 calculates the sum of the amplitude values of each unit block so as to calculate the energy of each unit block.

Figure 6:
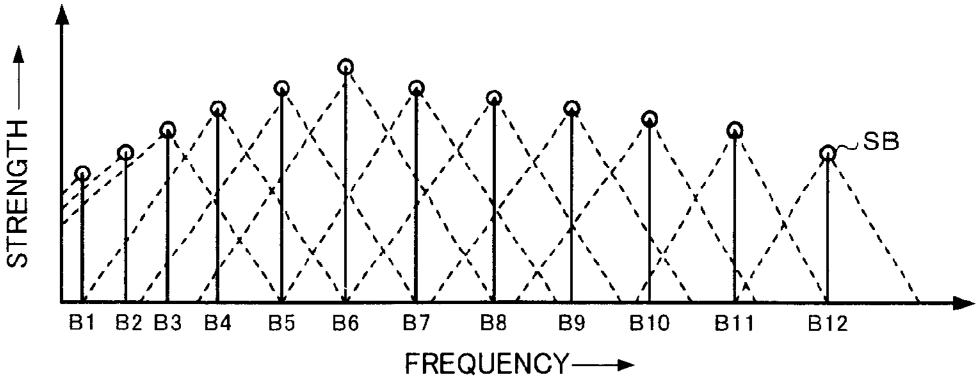
FIG. 6 is a graph showing an example of a spectrum of frequency bands divided corresponding to a critical band, a block floating, and so forth.

FIG. 6 shows an example of an output signal of the energy calculating circuit 302. In FIG. 6, a spectrum SB of the sum of each sub band is represented by a vertical line with a circle. In FIG. 6, the horizontal axis and the vertical axis represent the frequency and signal strength, respectively. For simplicity, in FIG. 6, only a spectrum B12 is denoted by "SB". The number of sub bands (unit blocks) is 12 (B1 to B12). Instead of the energy calculating circuit 302, a structural portion that calculates the peak value, average value, and so forth of amplitude values and performs a bit allocating process corresponding to the peak value, average value, and so forth of the amplitude values may be disposed.

The energy calculating circuit 302 designates a scale factor value. In reality, several positive values are provided as alternatives of a scale factor value. Among them, values that are larger than the maximum value of absolute values of spectrum data or MDCT coefficients of each unit block are selected. The minimum value of the selected values is used as a scale factor value of the unit block. Numbers are allocated to the alternatives of a scale factor value using for example several bits. The allocated numbers are stored in for example ROM (Read Only Memory) (not shown). At this point, the alternatives of a scale factor value increment by for example 2 dB. A number allocated to a scale factor value selected for a particular unit block is defined as scale factor information of the particular unit block.

An output signal (namely, each value of the spectrum SB) of the energy calculating circuit 302 is supplied to a convolution filter circuit 303. The convolution filter circuit 303 performs a convoluting process for multiplying a predetermined weighting function by a spectrum SB and adding them so as to consider the influence of the masking of the spectrum SB. Next, with reference to FIG. 6, the convoluting process will be described in detail. As was described above, FIG. 6 shows an example of a spectrum SB of each block. In the convoluting process of the convolution filter circuit 303, the sum of portions denoted by dotted lines is calculated. The convolution filter circuit 303 can be composed of a plurality of delaying devices, a plurality of multiplying devices, and a sum adding device. Each of the delaying devices successively delays the input data. Each of the multiplying devices multiplies output data of a relevant delaying device by a filter coefficient (weighting function). The sum adding device adds the output data of the multiplying devices.

Returning to FIG. 5, an output signal of the convolution filter circuit 303 is supplied to a calculating device 304. An allowance function (that represents a masking level) is supplied from an (n−ai) function generating circuit 305 to the calculating device 304. The calculating device 304 calculates a level α corresponding to an allowable noise level in an area convoluted by the convolution filter circuit 303 with the allowance function. As will be described later, the level α corresponding to the allowable noise level is an allowable level of each critical band as a result of an inversely convoluting process. The calculated value of the level α is controlled by increasing/decreasing the allowance function.

In other words, when the numbers allocated from the lowest critical band are denoted by i, the level α corresponding to the allowable noise level can be obtained by the following formula (1).

$$\alpha = S - (n - ai) \tag{1}$$

wherein n and α are constants; a>0; S is the strength of a convoluted spectrum. In formula (1), (n−ai) is an allowance function. In this example, n=38 and a=1 are given.

The level α calculated by the calculating device 304 is supplied to a dividing device 306. The dividing device 306 inversely convolutes the level α. As a result, the dividing device 306 generates a masking spectrum corresponding to the level α. The masking spectrum is an allowable noise spectrum. When the inversely convoluting process is performed, complicated calculations are required. However, according to the first embodiment of the present invention, with the dividing device 306 that is simply structured, the inversely convoluting process is performed. The masking spectrum is supplied to a combining circuit 307. In addition, data that represents a minimum audible curve RC (that will be described later) is supplied from a minimum audible curve generating circuit 312 to the combining circuit 307.

The combining circuit 307 combines the masking spectrum that is output from the dividing device 306 and the data that represents the minimum audible curve RC and generates a masking spectrum. The generated masking spectrum is supplied to a subtracting device 308. The timing of an output signal of the energy calculating circuit 302 (namely, the spectrum SB of each sub band) is adjusted by a delaying circuit 309. The resultant signal is supplied to the subtracting device 308. The subtracting device 308 performs a subtracting process corresponding to the masking spectrum and the spectrum SB.

Figure 7:
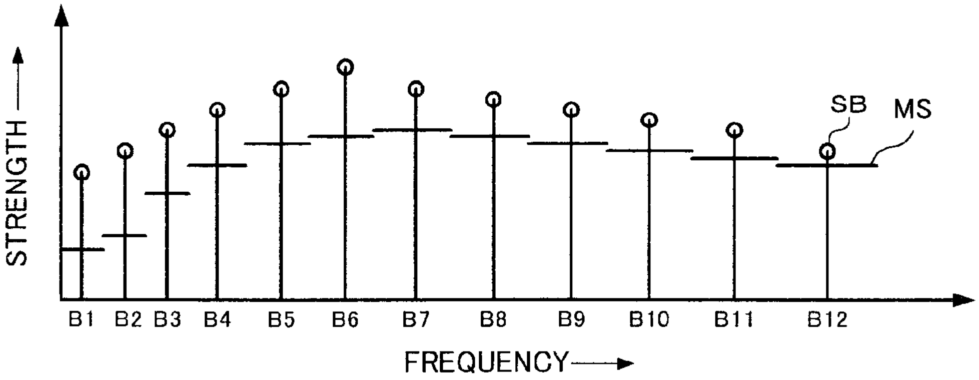
FIG. 7 is a graph showing an example of a masking spectrum.

As the result of the process, the spectrum SB of each block is masked so that the portion that is smaller than the level of the masking spectrum is masked. FIG. 7 shows an example of the masking process. Referring to FIG. 7, the portion that is smaller than the level of the masking spectrum (MS) of the spectrum SB is masked. For simplicity, in FIG. 7, only the spectrum B12 is denoted by "SB" and the level of the masking spectrum is denoted by "MS".

When the noise absolute level is equal to or smaller than the minimum audible curve RC, the noise is inaudible for humans. The minimum audible curve varies corresponding to the reproduction volume even in the same encoding method. However, in a real digital system, music data in for example a 16-bit dynamic range does not largely vary. Thus, assuming that the quantizing noise of the most audible frequency band at around 4 kHz is inaudible, it is supposed that the quantizing noise that is smaller than the level of the minimum audible curve is inaudible in other frequency bands.

Figure 8:
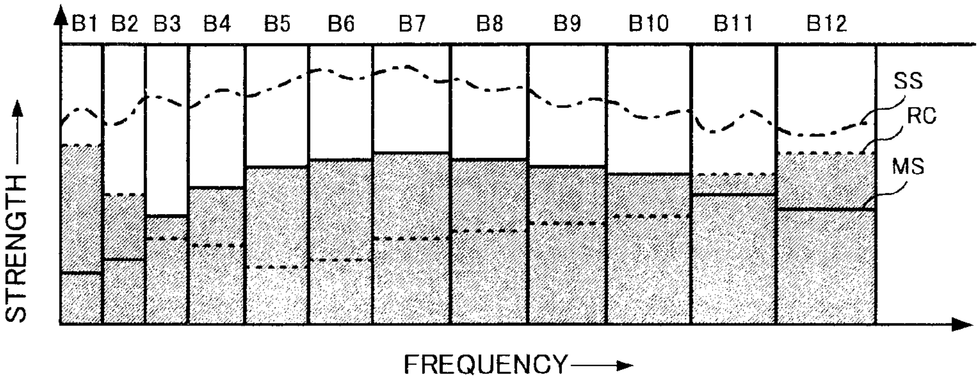
FIG. 8 is a graph for explaining a combination of a minimum audible curve and a masking spectrum.

Thus, when noise at around 4 kHz of a word length of the system is prevented from being audible, if the allowable noise level is obtained by combining the minimum audible curve RC and the masking spectrum MS, the allowable noise level can be represented as a hatched portion shown in FIG. 8. In this example, the level at 4 kHz of the minimum audible curve is set to the minimum level equivalent to for example 20 bits. In FIG. 8, SB of each block is denoted by a solid line, whereas MS of each block is denoted by a dotted line. However, in FIG. 8, for simplicity, only the spectrum B12 is represented with "SB", "MS", and "RC". In FIG. 8, a signal spectrum SS is denoted by a dashed line.

Returning to FIG. 5, an output signal of the subtracting device 308 is supplied to an allowable noise compensating circuit 310. The allowable noise compensating circuit 310 compensates the allowable noise level of the output signal of the subtracting device 308 corresponding to for example data of an equal roundness curve. In other words, the allowable noise compensating circuit 310 calculates allocated bits for each unit block corresponding to various parameters such as the above-described masking and hearing characteristic. An output signal of the allowable noise compensating circuit 310 is obtained as the final output data of the bit allocation calculating circuit 118 through an output terminal 311. In this example, the equal roundness curve is a characteristic curve that represents the hearing characteristic of humans. For example, the sound pressure of a sound at each frequency that is heard with the same strength of a pure sound at 1 kHz is plotted. The potted points are connected and represented as a curve. This curve is referred to as roundness equal sensitivity curve.

The equal roundness curve matches the minimum audible curve shown in FIG. 8. On the equal roundness curve, although the sound pressure at around 4 kHz is smaller than that at 1 kHz by 8 to 10 dB, the strength at 4 kHz is the same as that at 1 kHz. In contrast, unless the sound pressure at 50 Hz is larger than that at 1 kHz by around 15 dB, the strength at 50 Hz is not the same as that at 1 kHz. Thus, when noise that exceeds the level of the minimum audible curve RC (namely, the allowable noise level) has a frequency characteristic corresponding to the equal roundness curve, the noise can be prevented from being audible to humans. Thus, it is clear that in consideration of the equal roundness curve, the allowable noise level can be compensated corresponding to the hearing characteristics of humans.

Next, scale factor information will be described in detail. As alternatives of a scale factor value, a plurality of positive values (for example, 63 positive values) are stored in for example a memory of the bit allocation calculating circuit 118. Values that exceed the maximum value of the absolute values of the spectrum data or MDCT coefficients of a particular unit block are selected from the alternatives. The minimum value of the selected values is used as the scale factor value of the particular unit block. A number allocated to the selected scale factor value is defined as scale factor information of the particular unit block. The scale factor information is contained in the encoded data. The positive values as the alternatives of a scale factor value are allocated with numbers of six bits. The positive values increment by 2 dB.

When the scale factor information is controlled with an adding operation and a subtracting operation, the level of the reproduced audio data can be adjusted with an increment of 2 dB. For example, when the same values that are output from the normalization information changing circuit 119 are added or subtracted to/from the scale factor information of all the unit blocks, the levels of all the unit blocks can be adjusted by 2 dB. The scale factor information generated as the result of the adding/subtracting operations is limited to the range defined in the applied format.

Alternatively, when different values that are output from the normalization information changing circuit 119 are added or subtracted to/from the scale factor information of the respective unit blocks, the levels of the unit blocks can be separately adjusted. As a result, a filtering function can be accomplished. In more reality, when the normalization information changing circuit 119 outputs a pair of a unit block number and a value to be added or subtracted to/from the scale factor information of the unit block, unit blocks and values to be added or subtracted to/from scale factor information of the unit blocks are correlated.

By changing scale factor information in the above-described manner, functions that will be described with reference to FIGS. 10, 11, and 12 can be accomplished. In addition, a digital signal recording apparatus that performs other than QMF and MDCT processes as the sub band coding method and the encoding method is known. For example, when an encoding method for performing a quantizing operation using normalization information and bit allocation information (for example, a method corresponding to the sub band coding method using for example filter banks is used, the editing process for changing normalization information can be performed.

Next, with reference to FIG. 9, an example of the structure of a digital signal reproducing and/or recording apparatus according to the present invention will be described. Encoded data that is reproduced from a record medium such as a magneto optical disc is supplied to an input terminal 707. In addition, block size information used in the encoding process (namely, data equivalent to output signals of the output terminals 113, 115, and 117 shown in FIG. 1) is supplied to an input terminal 708. In addition, a normalization information changing circuit 709 generates a parameter used for the editing process corresponding to a user's command that is input through for example an operating panel (the parameter is for example, a value to be added or subtracted to/from scale factor information of each unit block).

The encoded data is supplied from the input terminal 707 to a calculating device 710. The calculating device 710 also receives numeric data from a normalization information changing circuit 709. The calculating devices adds the numeric data supplied from the normalization information changing circuit 119 corresponding to supplied scale factor information of encoded data. When the numeric value that is output from the normalization information changing circuit 709 is a negative value, the calculating device 710 operates as a subtracting device. An output signal of the calculating device 710 is supplied to an adaptive bit allocation decoding circuit 706 and an output terminal 711.

The adaptive bit allocation decoding circuit 706 references the adaptive bit allocation information and deallocates the allocated bits. An output signal of the adaptive bit allocation decoding circuit 706 is supplied to inversely orthogonally transforming circuits 703, 704, and 705. The inversely orthogonally transforming circuits 703, 704, and 705 transform a frequency-base signal into a time-basis signal. An output signal of the inversely orthogonally transforming circuit 703 is supplied to a band combining filter 701. Output signals of the inversely orthogonally transforming circuit 704 and 705 are supplied to a band combining filter 702. Each of the inversely orthogonally transforming circuits 703, 704, and 705 may be composed of an inversely modified DCT transforming circuit (IMDCT).

The band combining filter 702 combines supplied signals and supplies the combined result to the band combining filter 701. The band combining filter 701 combines supplied signals and supplies the combined result to a terminal 700. In such a manner, time-base signals of separated sub bands that are output from the inversely orthogonally transforming circuits 703, 704, and 705 are decoded into a signal of the entire band. Each of the band combining filters 701 and 702 may be composed of for example an IQMF (Inverse Quadrature Mirror Filter). Decoded signals of the entire band are supplied to a general configuration for outputting the reproduction sound contains D/A converter, a speaker or so forth (not shown) via the output terminal 700.

By operating scale factor information with an adding operation or a subtracting operation of the calculating device 710, the level adjustment of the reproduced data can be performed every for example 2 dB. When the normalization information changing circuit 709 outputs the same value and adds or subtracts the value to/from scale factor information of each unit block. Thus, the level adjustment of each unit block can be performed for 2 dB. In such a process, scale factor information generated as a result of the adding/subtracting operation is limited in the range of scale factor values defined corresponding to the applied format.

Alternatively, when the normalization information changing circuit 709 outputs a different value for each unit block and adds or subtracts the different value to/from scale factor information of each unit block, the level adjustment of each unit block can be performed. As a result, a filter function can be accomplished. In reality, the normalization information changing circuit 709 outputs a set of each unit block number and a value to be added or subtracted thereto/therefrom. Thus, each unit block can be correlated with a value to be added or subtracted to/from scale factor information.

Next, an editing process performed by changing scale factor information will be described in detail. FIG. 10 shows an example of a block floating process as a normalizing process affected to encoded data that is output from the adaptive bit allocation encoding circuit 706. In FIG. 10, it is assumed that 10 normalization levels 0 to 9 are prepared. The maximum spectrum data in the individual unit blocks or a normalization level number corresponding to the minimum normalization level that is larger than MDCT coefficients is treated as scale factor information of the current unit block. Thus, in FIG. 10, the scale factor information corresponding to the block number 0 is 5, whereas the scale factor information corresponding to the block number 1 is 7. This designation applies to other blocks. As was described above with reference to FIG. 3, scale factor information is written to encoded data. Generally, corresponding to normalization information, data is decoded.

Figure 10:
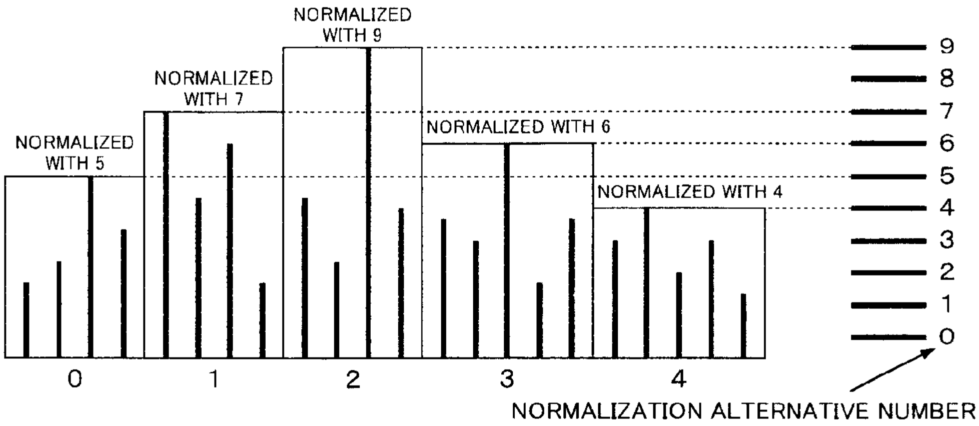
FIG. 10 is a schematic diagram for explaining a generation of normalization information.
Figure 11:
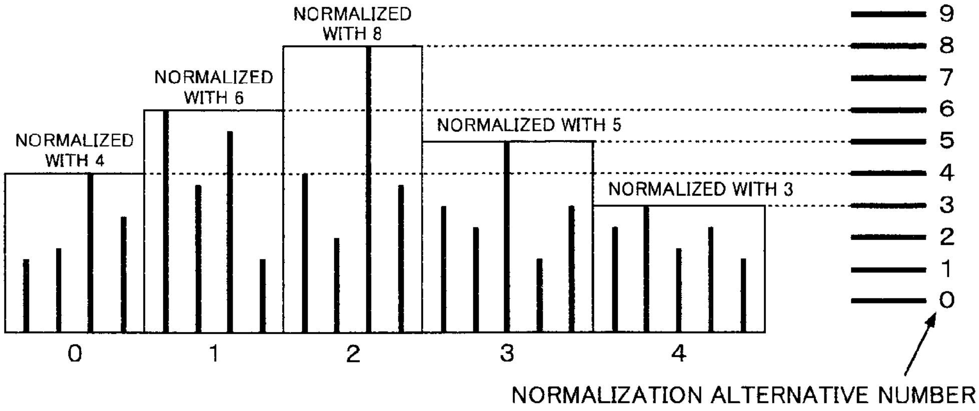
FIG. 11 is a schematic diagram for explaining a level operation by changing normalization information.

FIG. 11 shows an example of the operation of scale factor information shown in FIG. 10. When the normalization information changing circuit 119 outputs a value "−1" for all unit blocks and the calculating devices 120, 121, and 122 add the value "−1" to scale factor information as shown in FIG. 10, scale factor information becomes a value smaller than the original value by "1". In such a process, spectrum data or an MDCT coefficient of each unit block is decoded as a value that is smaller than the original value by 2 dB. In other words, the level adjustment is performed so that the signal level is lowered by for example 2 dB.

Figure 12:
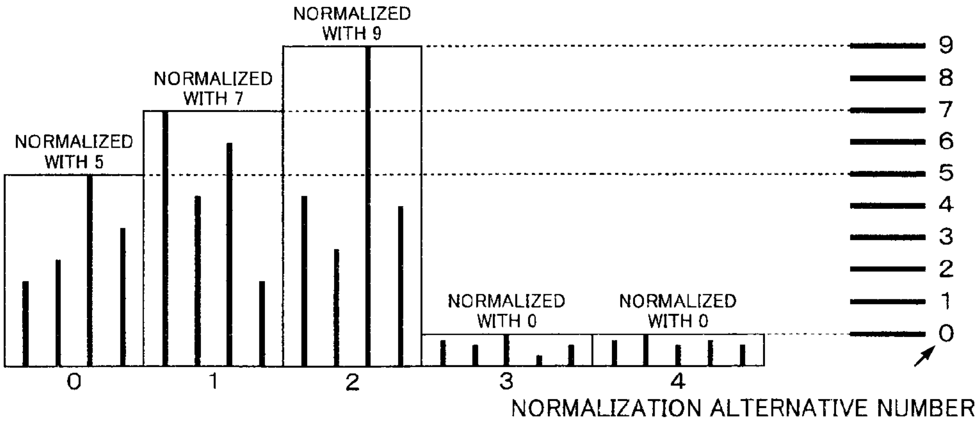
FIG. 12 is a schematic diagram for explaining a filtering operation by changing normalization information.

FIG. 12 shows another example of a process performed by the normalization information changing circuit 709 for scale factor information contained in encoded data. As shown in FIG. 10, when the normalization information changing circuit 119 output the value "−6" for the block of the block number 3 and the value "−4" for the block of the block number 4 and then these values are added to scale factor information of the blocks of the block numbers 3 and 4, the scale factor values of the blocks of the block numbers 3 and 4 become "0" as shown in FIG. 12. As a result, a filtering process is performed. In the example shown in FIG. 12, by adding negative values (or subtracting positive values) to scale factor values, they become "0". Alternatively, a scale factor value of a desired block may be forcedly set to "0".

In the examples shown in FIGS. 10 to 12, the number of unit blocks is five (unit block 0 to unit block 4) and the number of normalization alternatives is 10 (normalization alternative 0 to 9). However, in the format of a real record medium such as an MD (Mini Disc) that is a magneto optical disc, the number of unit blocks is 52 (unit block 0 to unit block 51) and the number of normalization alternatives is 64 (normalization alternative 0 to normalization alternative 63). In such a range, by finely designating unit blocks and parameters for changing scale factor information and so forth, the level adjusting process, the filtering process, and so forth can be more precisely performed.

Figure 9:
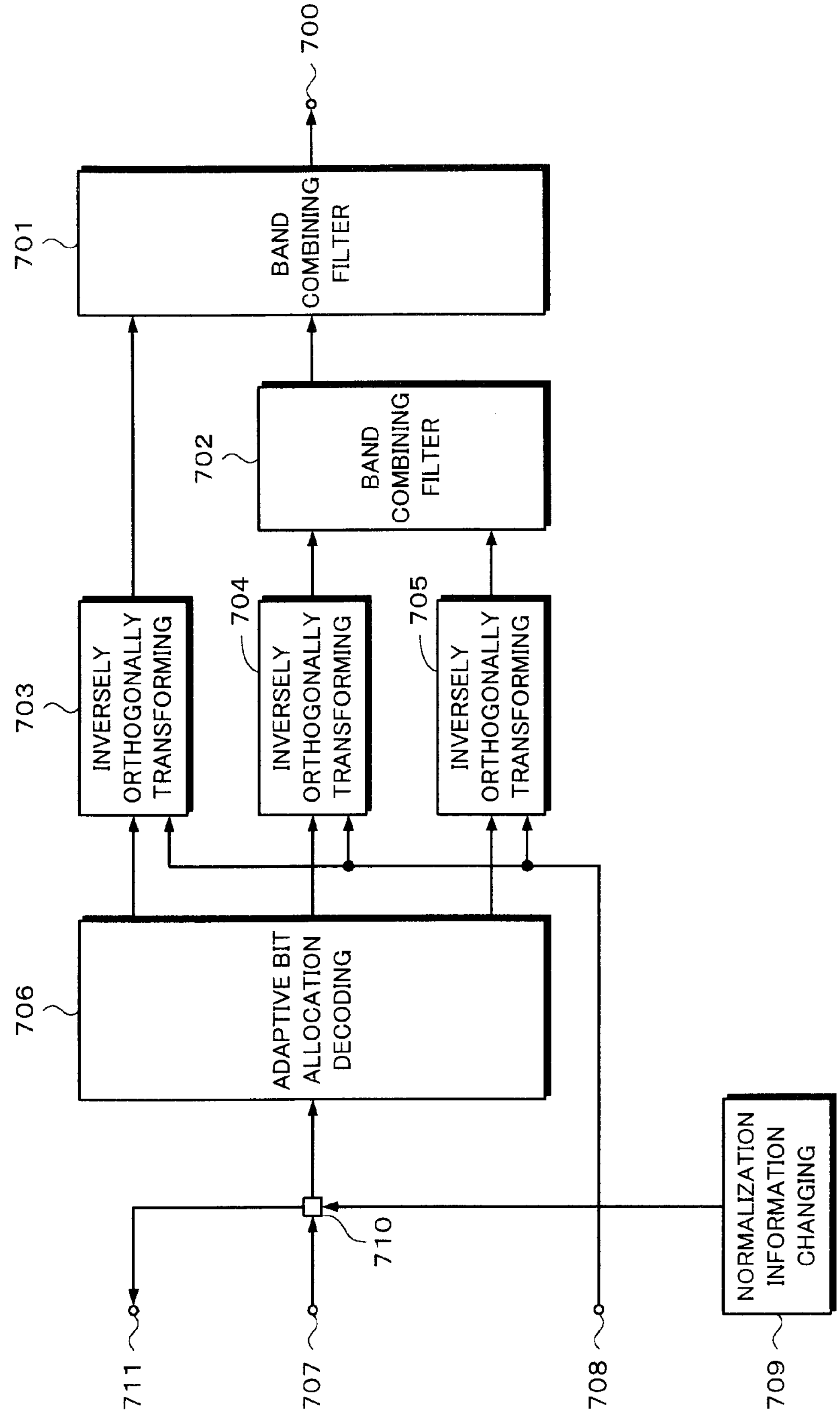
FIG. 9 is a block diagram showing an example of the structure of a digital signal reproducing and/or recording apparatus according to the present invention.

When a recording system is added to the structure portion shown in FIG. 9, data recorded on a record medium can be rewritten corresponding to an edited result. The record medium is for example a disc shaped record medium (such as an magneto optical disc or a magnetic disc), a tape shaped record medium (such as a magnetic tape or an optical tape), or a semiconductor memory (such as an IC memory, a memory stick, or a memory card). When an edited result is output through an output terminal 711 shown in FIG. 9 and written to a record medium, scale factor information can be written to a record medium using such a simple structure. Thus, with reference to a reproduced result (namely, while listening to a reproduced sound), the user or the like can perform an editing process and cause the recording system to rewrite data recorded on the record medium corresponding to the edited result. Thus, the result of the editing process due to a change of normalization information or the like can be stored. In addition, a record medium on which the result of the editing process has been recorded can be provided.

As the result of the editing process due to a change of scale factor information described with reference to FIGS. 10 to 12, various functions such as a reproduction level adjusting function, a fade-in function, a fade-out function, a filtering function, and a wowing function can be accomplished. However, the level adjustment is performed corresponding to at most an increase or decrease of one value of normalization information (for example, 2 dB). In other words, the level adjustment cannot be performed in the accuracy lower than 2 dB. Likewise, in the chronological direction, the level adjustment is performed in the encoding data format corresponding to the applied format (for example, in the accuracy of at most one frame or the like).

Figure 13:
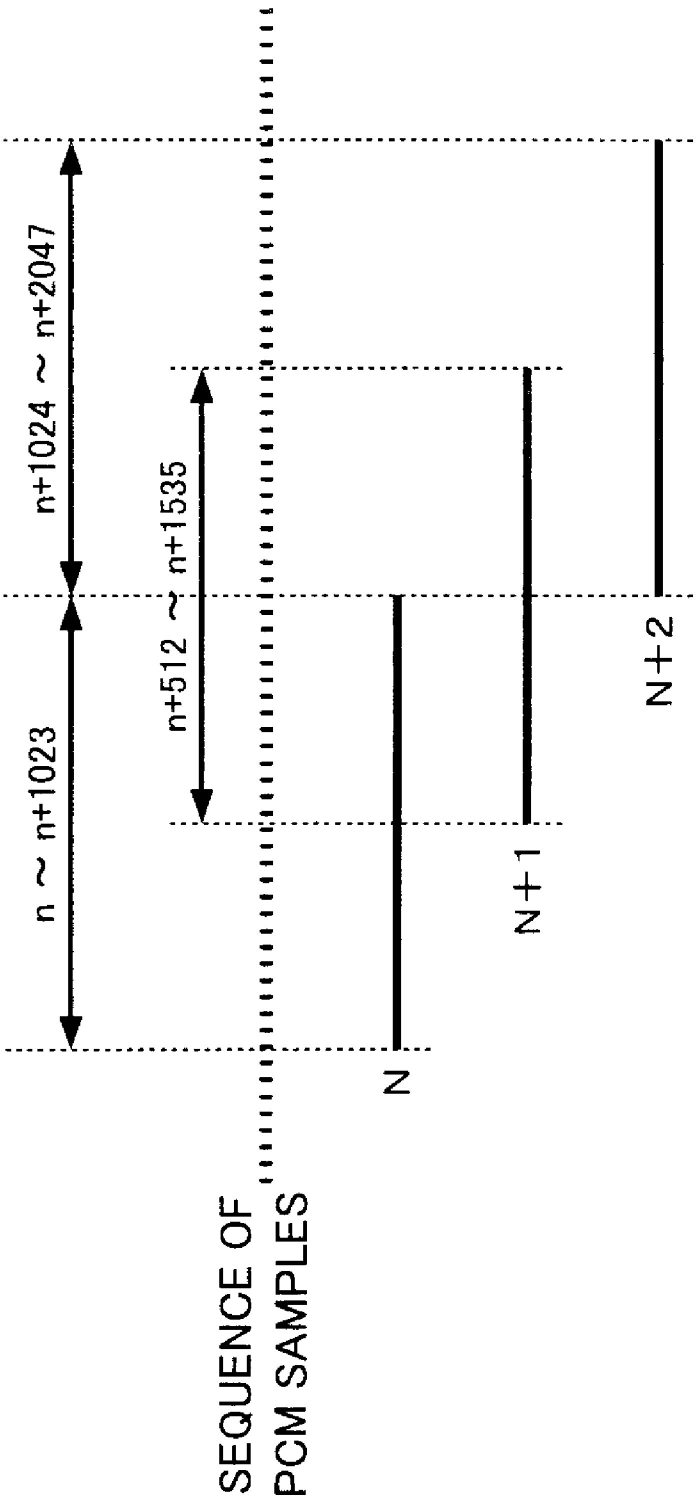
FIG. 13 is a schematic diagram for explaining an overlap of frames of encoded data.

To solve such problems, according to the present invention, encoded data is temporarily decoded to PCM samples. Thereafter, the PCM samples are edited in a desired manner. Thereafter, the edited PCM samples are encoded once again. As a result, encoded data is obtained. However, since each frame of encoded data contains data that overlaps with the adjacent frames, a process in consideration with the overlapped portions is required. This process will be described next. As was described above, one frame is composed of for example 1024 PCM samples. In the processes performed by the MDCTs 103, 104, and 105, each frame that is successively processed has an overlap portion of samples. An example of such a process is shown in FIG. 13. When 1024 samples that are sample n to sample n+1023 are processed in a frame N, 1024 PCM samples that are sample n+512 to sample n+1535 are processed in a frame N+1, whereas 1024 PCM samples that are sample n+1024 to sample n+2047 are processed in a frame N+2.

However, in the first frame, it is assumed before the sample sequence begins, there are 512 zero-data PCM samples as a virtual frame. The first frame is processed so that it overlaps with the virtual frame. Likewise, in the last frame, it is assumed after the sample sequence ends, there are 512 zero-data PCM samples as a virtual frame. The last frame is processed so that it overlaps with the virtual frame. In such a process, the number of samples substantially processed is 512.

As was descried above, by changing scale factor information, an editing process can be performed for each frame. However, in the MDCT process for each frame, it is clear that the overlap portion should be considered. This point will be described in reality with reference to FIG. 13. In FIG. 13, PCM samples are denoted as a set of points arranged in the chronological direction. When an editing process for changing scale factor information for the frame N and the frame N+1, the level adjusting function or the like as an editing process is accomplished for the PCM samples n+512 to the PCM samples n+1023. However, since the PCM sample n to the sample n+511 and the PCM sample n+1024 to the PCM sample n+1535 overlap with adjacent frames that have not been edited, the function of the editing process is not accomplished for these PCM samples.

In addition, the level adjustment is performed corresponding to an increase or decrease of at most one value of normalization information (for example, 2 dB). In addition, the filter function or the like is restricted with the number of unit blocks of one frame and a frequency division width corresponding to each unit block. In other words, the editing process is restricted corresponding to the applied encoding method and encoding data format.

Figure 14:
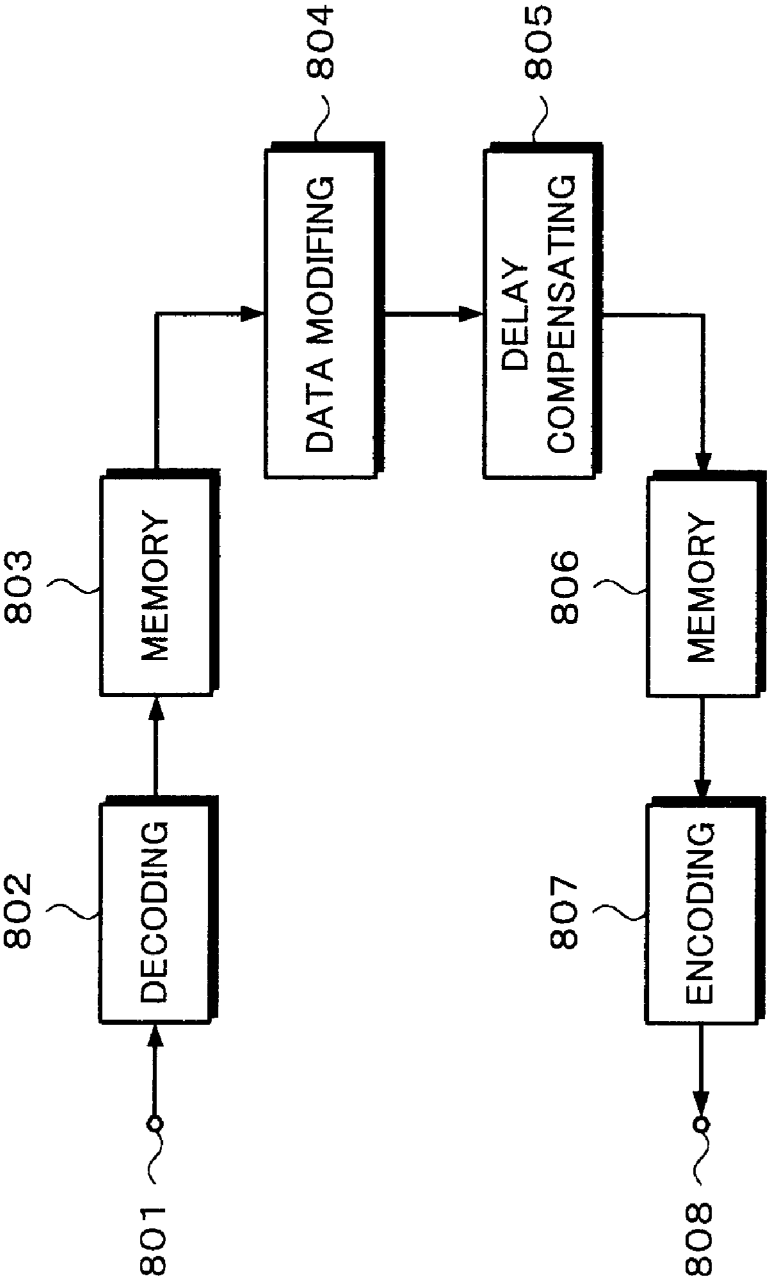
FIG. 14 is a block diagram showing an example of the structure for performing an editing process according to the present invention.

FIG. 14 shows an example of the structure for temporarily decoding encoded data, performing an editing process for decoded PCM samples, and encoding the edited PCM samples once again according to the present invention. Encoded data is supplied to a decoding circuit 802 through a terminal 801. The decoding circuit 802 partly decodes the supplied encoded data and generates PCM samples. The decoding circuit 802 partly decodes the encoded data corresponding to a command issued by the user or the like through for example an operation panel. In other words, the user can designate a portion of encoded data that is decoded by the decoding circuit 802. The decoding circuit 802 generates PCM samples and supplies them to a memory 803. The memory 803 temporarily stores the PCM samples.

A data modifing circuit 804 performs one of various modifing processes as editing processes for the PCM samples stored in the memory 803. Examples of the modifing processes are a reverb process, an echo process, a filtering process, a compressor process, and an equalizing process. The data modifing circuit 804 supplies the modified PCM samples to a delay compensating circuit 805. The delay compensating circuit 805 performs a delay compensating process for the modified PCM samples. The compensated PCM samples are temporarily stored in a memory 806. An encoding circuit 807 performs an encoding process for the PCM samples stored in the memory 806. The encoding circuit 807 outputs the generated encoded data to an output terminal 808. Thus, encoded data that has been edited can be recorded to a record medium through the output terminal 808.

Next, the process of the delay compensating circuit 805 will be descried in detail. The delay compensating process is a phase adjusting process for compensating a time lag of the output data of the encoding circuit 807 against the encoded data that is input from the terminal 801 due to the operation time periods of the decoding circuit 802 and the encoding circuit 807. Thus, the delay compensating circuit 805 secures the chronological relation between a frame that is output from the encoding circuit 807 and a frame that is input from the terminal 801. The delay amount depends on the structure of a band dividing filter or a band combining filter (for example, the number of banks, an input timing of such a filter, the number of zero-data PCM samples, and a buffering using windows in the MDCT process).

For example, the number of banks of each of the band dividing filters 101 and 102 shown in FIG. 1 is 48. Likewise, the number of banks of each of the band combining filters 702 and 701 shown in FIG. 9 is 48. When 512 zero-data PCM samples are used for a virtual frame that overlaps with the first frame, the delay amount due to the encoding process and the decoding process becomes 653 PCM samples. The delay compensating circuit 805 may be disposed at any position between the output of the decoding circuit 802 and the output of the encoding circuit 807. The delay compensating circuit 805 may have a buffer memory or the like for compensating the delay amount. Alternatively, the delay compensating circuit 805 may be a timing controlling circuit that controls the memories 803 and 806 so that they are accessed at timings in consideration of the delay amount.

The decoding circuit 802 shown in FIG. 14 has the structure shown in FIG. 9. On the other hand, the encoding circuit 807 shown in FIG. 14 has the structure shown in FIG. 1. The structure portion shown in FIG. 14 temporarily decodes encoded data, performs an editing process for the decoded PCM samples, encodes the edited PCM samples, and writes the generated encoded data to a record medium. Besides a magneto optical disc, an example of the record medium may be a disc shaped record medium (such as a magnetic disc), a tape shaped record medium (such as a magnetic tape or an optical tape), or a semiconductor memory (such as an IC memory, a memory stick, or a memory card).

Figure 16:
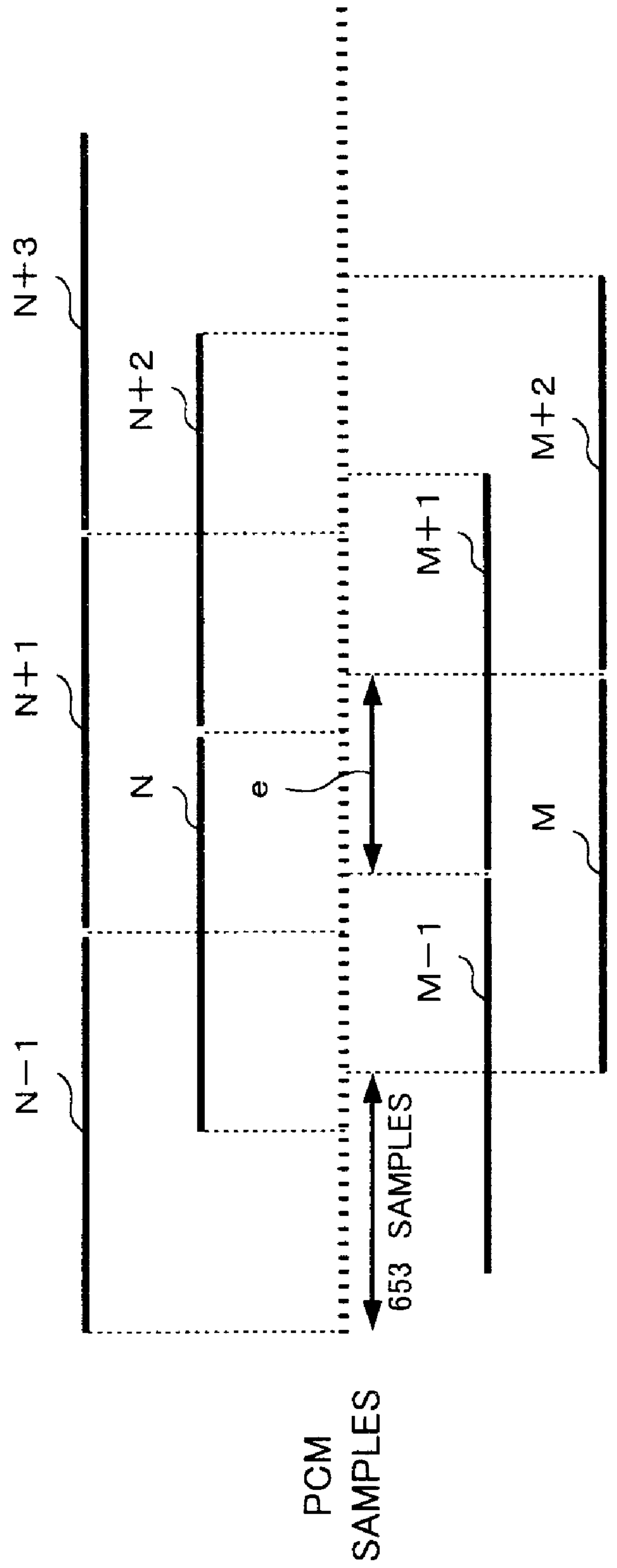
FIG. 16 is a schematic diagram for explaining an example of the chronological relation of individual frames in the editing process according to the present invention.

Next, with reference to FIG. 16, the chronological relation between the encoded data that is supplied through the input terminal 801 and the encoded data that is output through the output terminal 808 is explained. In FIG. 16, frames N−1, N, N+1, N+2, and N+3 shown in FIG. 16 represent frames in the encoded data that are input through the input terminal 801. PCM samples decoded from these frames are denoted as a set of points that are arranged in the chronological direction. The chronological relation of the decoded PCM samples does not vary even if the amplitude value of the signal shown in FIG. 12 is edited. However, to maintain the chronological relation between frames of encoded data generated by the encoding circuit 807 and frame of encoded data that has not been edited, the delay for 653 points should be compensated.

When the first frame of encoded PCM samples that have been delay compensated is denoted by a frame M−1, the last 512 PCM samples of the frame M−1 are 512 PCM samples starting from the position of which the decoded PCM samples are delayed by 653 samples. At this point, since the frame M−1 is the first encoded frame, the first 512 PCM samples of the frame M−1 are zero-data PCM samples. Thereafter, the frames M+1, M+2, and M+3 are successively encoded and output through the output terminal 808. In this case, the frame M−1 corresponds to the frame N−1; the frame M corresponds to the frame N; the frame M+1 corresponds to the frame N+1; the frame M+2 corresponds to the frame N+2; and the frame M+3 corresponds to the frame N+3.

In such a relation, to generate PCM samples of for example the frame M, it is necessary to decode the frames N−1 to N+1. In other words, to edit a desired frame and then encode it, at least one preceding frame and one following frame of the current frame are required.

However, for the frames M−1, M, and M+1 that are output from the output terminal 808, the relation of an overlap should be considered. In other words, in the case that a portion e shown in FIG. 16 is edited, if the frame N is edited and then substituted with the frame M, due to the overlap portion with the frame M+1, a desired edit result cannot be obtained. In this case, to obtain a desired edit result, it is necessary to edit the frame N+1 and then replace the result with the frame M+1. In this case, as was descried above, it is necessary to decode the frames N to N+3.

In other words, to edit the portion e and obtain a desired result, the frames N−1 to N+3 are extracted and decoded. Thus, PCM samples are generated and edited. As a result, the frames M and M+1 are obtained and used instead of the frames N and N+1. In addition, by considering the chronological relation between data generated for obtaining a desired edit result and a frame to be decoded for generating PCM samples, data for a relatively long time period can be edited. In addition, according to the embodiment of the present invention, an influence of windows in the orthogonal transform is not considered. However, to consider it, the editing process can be finely performed.

This point will be described practically with reference to FIGS. 15A, 15B, and 15C.

Figure 15A:
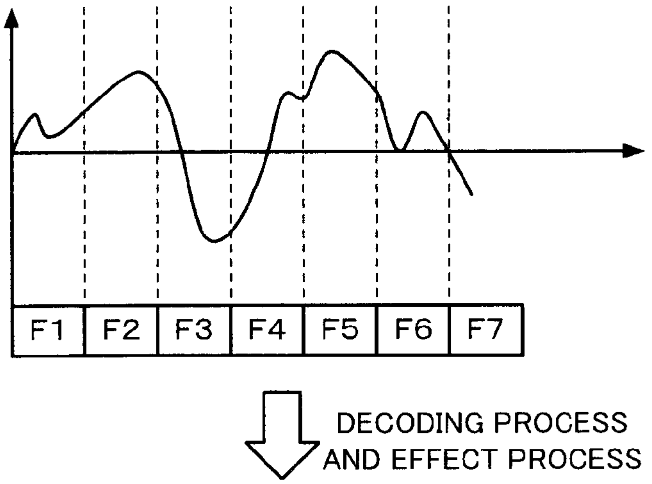
FIG. 15A is a schematic diagram showing the relation between a signal waveform and frames recorded on a record medium.
Figure 15B:
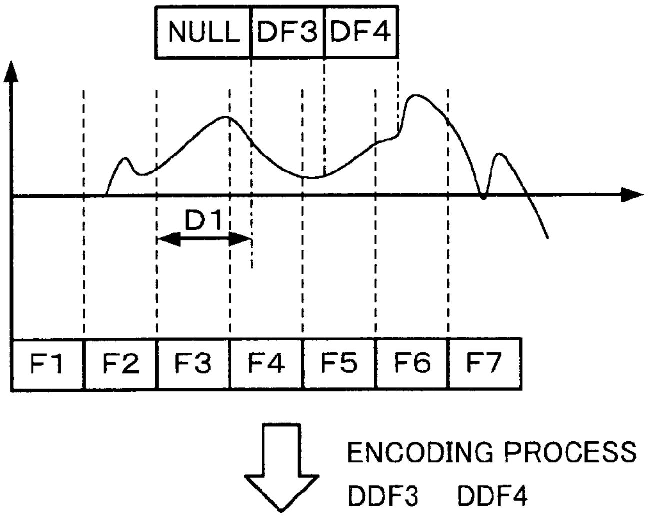
FIG. 15B is a schematic diagram showing the relation between a signal waveform and frames of which a decoding process and an effect process have been performed.
Figure 15C:
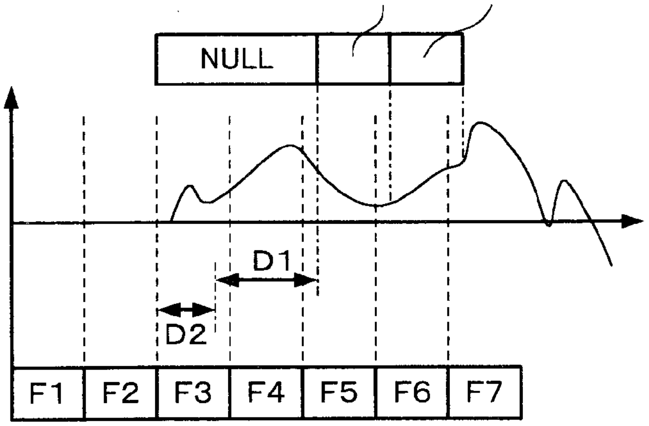
FIG. 15C is a schematic diagram showing the relation between a signal waveform and frames of which an encoding process has been performed.

FIG. 15A shows a signal recorded on a record medium. In FIG. 15A, F1, F2, F3, F4, F5, and F6 denote frames formed on a record medium. Each frame is a data record unit. Each frame contains a digital encoded signal as represented by a signal waveform.

Next, the case of which an effect process is performed for the frames F3 and F4 shown in FIG. 15A will be described.

The frames F3 and F4 to which the effect process is performed are input to the terminal 801 shown in FIG. 14. Thereafter, the frames F3 and F4 are supplied to the decoding circuit 802. The decoding circuit 802 decodes the frames F3 and F4 and supplies the decoded frames to the memory 803. The memory 803 stores the decoded frames. The digitally decoded signals of the frames F3 and F4 stored in the memory 803 are supplied to the data changing circuit 804. The data changing circuit 804 performs the effect process for the digitally decoded signals of the frames F3 and F4. The decoding process and the effect process result in a delay D1 as shown in FIG. 15B. In other words, as was described above, for the frame F3 as the first frame, 512 zero-data PCM samples are used as a virtual frame that precedes the first frame F3. The frame F3 is processed so that it overlaps with the virtual frame. When the processed results of the frames F3 and F4 are denoted by frame DF3 and DF4, respectively, they can be represented as a part of a waveform having a delay D1. In other words, the frames DF3 and DF4 are generated as a part of the signal wave of which a zero-data signal is filled before the signal wave shown in FIG. 15A starts.

When a signal with a delay D1 is encoded by the encoding circuit 807, as with the case of the decoding process, the delay D2 takes place. As a part of a signal of which the delay D1 and the delay D2 are added in the signal waveform shown in FIG. 15A, frames DDF3 and DDF4 are generated. In other words, the frames DDF3 and DDF4 are generated as a part of the signal waveform of which zero-data signal is filled in the period of the delay D1 and the delay D2 from the beginning of the frame 1 of the record medium.

When the frames DDF3 and DDF4 are rewritten to positions on the record medium corresponding to the time information of the frames DDF3 and DDF4, if the delay compensating process of the delay compensating circuit 805 have not been performed for the frames DDF3 and DDF4, the frame DDF3 is overwritten to the positions of the frames F5 and F6 on the record medium. On the other hand, the frame DDF4 is overwritten to the positions of the frames F6 and F7 on the record medium.

Thus, the frames F1, F2, F3, and F4, a part of the frame F5, the frames DDF3 and DDF4 that have been effect processed, and a part of the frame F7 have been recorded on the record medium. As a result, the continuity of the signal is lost.

To solve this problem, the time information of the generated frames DDF3 and DDF4 is offset by the total time period of the delay amounts D1 and D2. Thus, the frames DDF3 and DDF4 can be rewritten to the positions of the frames F3 and F4 on the record medium, respectively. As a result, the continuity of the signal is secured. In addition, a record medium contains frames that have been effect processed can be provided.

Next, the case of which a part of encoded PCM data recorded on a record medium is decoded, edited, and then rewritten to the record medium will be described with reference to FIGS. 17A, 17B, and 17C.

Figures 17A, 17B, 17C:
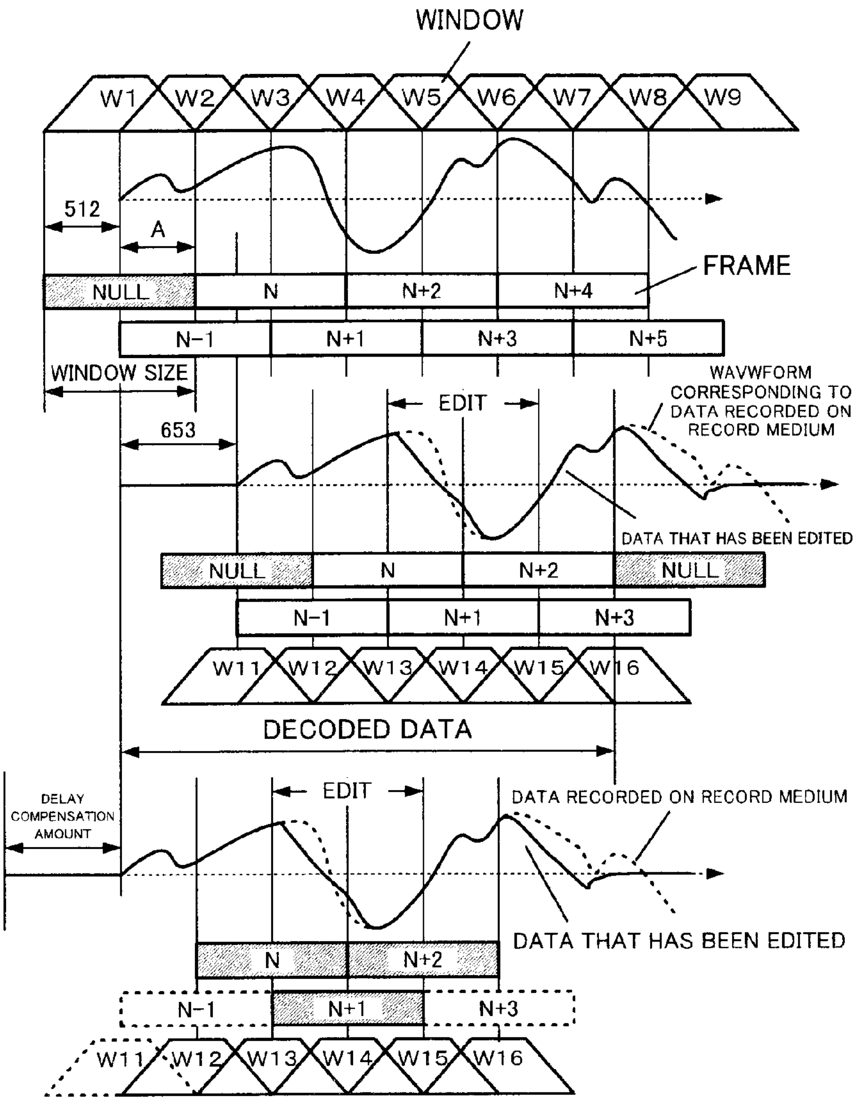
FIG. 17A is a schematic diagram showing the case that input PCM data that is filtered with windows and encoded for each frame.
FIG. 17B is a schematic diagram showing the case that part of the PCM data that has been encoded as shown in FIG. 17A and recorded on a record medium is edited.
FIG. 17C is a schematic diagram showing the case that filtering positions of the windows are compensated for a delay compensation amount.

FIG. 17A shows the case that input PCM data is filtered with windows and encoded for each frame. In this example, the size of each window is the same as the size of each frame. In this example, the size of each window is 1024 samples.

For example, a frame N of the input PCM data is filtered with three windows W2, W3, and W4 and then combined.

When a portion A of the PCM data shown in FIG. 17A is encoded, the portion A is generated with frames N−2 and N−1. In addition, PCM data that has been filtered with the window W1 and W2 is used.

Since the portion A is the beginning portion of the PCM data, there is only one adjacent frame that is one side of the frame N. Thus, null-data should be added to a frame corresponding to the first half of the window W1. As a result, one of the two adjacent frames of the portion A is a null-frame.

When PCM data shown in FIG. 17A is encoded, the frames N−1, N, N+1, N+2, . . . , and N+5 are recorded to the record medium. However, the null-frame is not recorded to the record medium. Thus, only the minimum number of frames that compose the input PCM data is recorded on the record medium. In other words, frames that are required for the encoding process are not recorded to a record medium.

Next, with reference to FIG. 17B, the case of which a part of PCM data that has been encoded and recorded on a record medium as shown in FIG. 17A will be described.

In this example, a portion EDIT shown in FIG. 17B of PCM data that has been encoded and recorded on a record medium as shown in FIG. 17A is edited. In this case, the frames N, N+1, N+2, and N+3 should be decoded. In the example shown in FIG. 17B, for easy understanding, the frame N−1 is also decoded.

When the five frames are decoded, since the first frame N−1 and the last frame N+3 each have one adjacent frame, they canot be decoded. Thus, to decode the frames N−1 and N+3, null-frames are used as their adjacent frames. The decoded PCM data is edited. As was described above, the start position of the frame N−1 chronologically deviates due to phase delays of the null-frame and the number of banks of the filter by 653 frames.

When the portion EDIT of the decoded PCM data is edited, it is clear that the waveform corresponding to the data recorded on the record medium is different from the waveform of the edited portion.

The reason why the waveform of the second half of the frame N+3 is different from the waveform corresponding to the data recorded on the record medium is in that when the second half of the frame N+3 is decoded, the null-frame is used instead of the first half of the frame N+4.

On the other hand, since the frame N−1 is encoded using a null-frame, when the frame N−1 is decoded, the waveform of the PCM signal decoding using the null-frame is the same as the waveform of the input PCM signal.

It is necessary to rewrite the edited PCM signal to the relevant frame positions on the record medium.

At this point, when the PCM signal is encoded with the same widows shown in FIG. 17A (namely, the windows W1, W2, W3, . . . and so forth), these windows deviate by the delay in the decoding process.

To solve this problem, when a signal is filtered with new windows W11, W12, W12, W13, . . . and W16 as shown in FIG. 17B, a signal with the same chronological relation as that shown in FIG. 17A can be obtained.

Thus, it can be said that the window W11 shown in FIG. 17B corresponds to the windows W1 shown in FIG. 17A; the window W12 shown in FIG. 17B corresponds to the window W2 shown in FIG. 17A; and the window W13 shown in FIG. 17B corresponds to the window W3 shown in FIG. 17A.

As a result, when the filtering positions using windows are moved corresponding to the delay compensation amount as shown in FIG. 17C, the encoded frames N, N+1, and N+2 can be rewritten to the frame positions corresponding thereto on the record medium.

Figure 18:
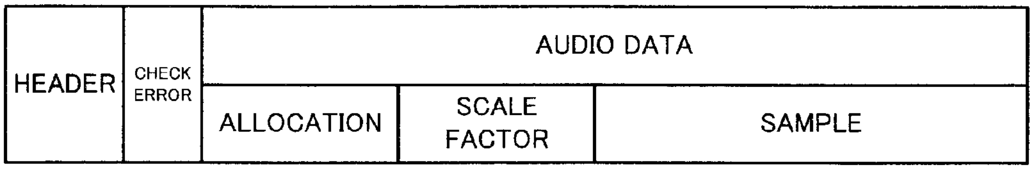
FIG. 18 is a schematic diagram showing an encoded data format corresponding to the MPEG audio format.

According to the first embodiment and the second embodiment of the present invention, in a combination of MDCT, band division considering the hearing characteristics of humans, and bit allocations of individual sub bands, a normalizing process and a quantizing process are performed in each sub band for encoded data corresponding to a highly efficiently encoding method. Alternatively, the present invention can be applied to another encoding method such as an encoding data format corresponding to the MPEG audio standard. FIG. 18 shows an encoding data format corresponding to the MPEG audio standard.

The header is composed of 32 bits (fixed length). The header contains information of a synchronous word, an ID, a layer, a protection bit, a bit rate index, a sampling frequency, a padding bit, a private bit, a mode, a copyright protection state code, an original/copy representing code, an emphasis, and so forth. The header is followed by optional error check data. The error check data is followed by audio data. Since audio data contains ring allocation information and scale factor information along with sample data, the present invention can be applied to such a data format.

As normalization information, other than scale factor information may be used corresponding to the encoding method. In such a case, the present invention can be applied.

According to the present invention, encoded data that is temporarily formed corresponding to for example a digital audio signal is partly decoded, edited, and then encoded once again. Thus, restrictions due to the level adjustment width, the filter function, and the chronological process can be suppressed in the editing process. Thus, data can be more finely edited.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A digital signal processing apparatus for processing an input digital signal that has been segmented as blocks each having a predetermined data amount and highly efficiently encoded along with adjacent blocks, comprising:

decoding means for decoding the highly efficiently encoded digital signal along with adjacent blocks;

modifying process means for modifying the decoded digital signal;

encoding means for highly efficiently encoding the modified digital signal along with adjacent blocks; and delay compensating means for compensating a delay of the decoded signal decoded by said decoding means;

wherein said encoding means comprises:

band dividing means for dividing the input digital signal into a plurality of frequency band components;

block segmenting and encoding means for segmenting a sequence of samples of which the plurality of frequency band components is arranged in chronological direction and/or frequency direction into blocks and encoding the blocks;

normalization processing means for normalizing each block that has been encoded by said encoding means and generating normalization information;

quantized coefficient calculating means for calculating a quantized coefficient that represents the feature of each block of the signal components;

bit allocating means for deciding the bit allocation amount of each block corresponding to the quantized coefficient calculated by said quantized coefficient calculating means; and encoded data generating means for re-quantizing each block corresponding to the normalization information generated by said normalization processing means and the bit allocation amount allocated by said bit allocating means and generating encoded data corresponding to a predetermined format.

2. The digital signal processing apparatus as set forth in claim 1, wherein said decoding means decodes the digital signal corresponding to the information compressed parameter for each block.

3. The digital signal processing apparatus as set forth in claim 1, further comprising:

operating means for allowing the user to designate a highly efficiently encoded digital signal to be edited.

4. The digital signal processing apparatus as set forth in claim 1, wherein the input signal that has been highly efficiently encoded is read from a record medium.

5. The digital signal processing apparatus as set forth in claim 4, wherein a delay of the digital signal that has been highly efficiently encoded by said encoding means is compensated by said delay compensating means and then the compensated signal is written to the record medium so that the phase of the compensated signal matches the phase of the digital signal that has been read from the record medium.

6. A digital signal processing method for processing an input digital signal that has been segmented as blocks each having a predetermined data amount and highly efficiently encoded along with adjacent blocks, comprising the steps of:

(a) decoding the highly efficiently encoded digital signal along with adjacent blocks;

(b) modifying the decoded digital signal; and (c) highly efficiently encoding the changed digital signal along with adjacent blocks and compensating a delay of the decoded signal decoded at step (a);

wherein step (a) comprises:

(d) dividing the input digital signal into a plurality of frequency band components;

(e) segmenting a sequence of samples of which the plurality of frequency band components is arranged in chronological direction and/or frequency direction into blocks and encoding the blocks;

(f) normalizing each block that has been encoded by said encoding means and generating normalization information;

(g) calculating a quantized coefficient that represents the feature of each block of the signal components;

(h) deciding the bit allocation amount of each block corresponding to the quantized coefficient calculated at step (g); and (i) re-quantizing each block corresponding to the normalization information generated at step (f) and the bit allocation amount allocated at step (h) and generating encoded data corresponding to a predetermined format.

7. The digital signal processing method as set forth in claim 6, wherein step (a) is performed by decoding the digital signal corresponding to the information compressed parameter for each block.

8. The digital signal processing method as set forth in claim 6, further comprising the step of:

(j) allowing the user to designate a highly efficiently encoded digital signal to be edited.

9. The digital signal processing method as set forth in claim 6, wherein the input signal that has been highly efficiently encoded is read from a record medium.

10. The digital signal processing method as set forth in claim 9, wherein a delay of the digital signal that has been highly efficiently encoded at step (a) is compensated at step (c) and then the compensated signal is written to the record medium so that the phase of the compensated signal matches the phase of the digital signal that has been read from the record medium.

* * * * *

UNITED STATES PATENT AND TRADEMARK OFFICE

CERTIFICATE OF CORRECTION

PATENT NO. : 6,850,578 B1
DATED : February 1, 2005
INVENTOR(S) : Tomohiro Koyata It is certified that error appears in the above-identified patent and that said Letters Patent is hereby corrected as shown below:

Column 20,
Line 45, change “signal components” to -- frequency band components --.
Line 64, change “the user” to -- a user --.

Column 21,
Line 9, change “the phase” to -- phase --.
Line 34, change “signal components” to -- frequency band components --.

Column 22,
Line 1, change “the bit” to -- a bit --.
Line 13, change “the information” to -- an information --.
Line 17, change “the user” to -- a user --.
Line 27, change “the compensated” to -- a compensated --.

Signed and Sealed this

Twenty-sixth Day of July, 2005

Jon W. Dudas

JON W. DUDAS
*Director of the United States Patent and Trademark Office*